(12) United States Patent  
Foroudian et al.

(10) Patent No.: US 7,512,204 B1  
(45) Date of Patent: Mar. 31, 2009

(54) MULTI-PHASE-LOCKED LOOP (PLL) SOLUTION FOR MULTI-LINK MULTI-RATE LINE CARD APPLICATIONS

(75) Inventors: Jamshid Foroudian, Campbell, CA (US); John S. Oh, San Jose, CA (US)

(73) Assignee: Altera Corporation, San Jose, CA (US)

( * ) Notice: Subject to any disclaimer, the term of this patent is extended or adjusted under 35 U.S.C. 154(b) by 717 days.

(21) Appl. No.: 11/084,366

(22) Filed: Mar. 18, 2005

(51) Int. Cl.
*H03D 3/24* (2006.01)

(52) U.S. Cl. .................................................. 375/376

(58) Field of Classification Search ................. 375/376
See application file for complete search history.

(56) References Cited

U.S. PATENT DOCUMENTS

| | | | |
|---|---|---|---|
| 6,181,923 B1 * | 1/2001 | Kawano et al. ............. | 455/257 |
| 6,833,764 B1 * | 12/2004 | Dean ............................. | 331/2 |
| 7,102,446 B1 * | 9/2006 | Lee et al. ...................... | 331/11 |
| 7,158,899 B2 * | 1/2007 | Sunter et al. .................. | 702/69 |
| 7,194,651 B2 * | 3/2007 | Knee et al. .................... | 713/500 |
| 7,228,446 B2 * | 6/2007 | Jorgenson et al. ............ | 713/322 |
| 7,308,060 B1 * | 12/2007 | Wall et al. .................... | 375/355 |

OTHER PUBLICATIONS

Altera, "Stratix II Device Handbook, vol. 2", Altera Feb. 2004, this document can be found at http://www.fulcrum.ru/Read/CDROMs/Altera/literature /hb/stx2/stx2_sii5v2.pdf 476 pages.*

Altera, "Stratix Device Handbook, vol. 2", Altera Nov. 2003, this document can be found at http://www.altera.ru/Disks/Altera%20Documentation %20Library/ literature/hb/stx/stratix_vol_2.pdf 640 pages.*

Altera, "AN 237: Using High-Speed Transceiver Blocks in Stratix GX Devices", Nov. 2002), this document can be found at http://www.altera.ru/Disks/Altera%20 Documentation%20 Library/literature/an/an237.pdf 58 pages.*

MK2069-01 "VCXO-Based Line Card Clock Synchronizer", MDS 2069-01 H 1 Revision 050203 Integrated Circuit Systems Feb. 3, 2005.*

(Continued)

*Primary Examiner*—Juan A Torres
(74) *Attorney, Agent, or Firm*—Weaver Austin Villeneuve & Sampson LLP

(57) ABSTRACT

A multi-phase-locked loop (PLL) solution is described for multi-link multi-rate line cards. A reconfigurable enhanced phase-locked loop (EPLL) associated with a particular port in a line card is cascaded with an fast phase-locked loop (FPLL) and their combined output is used to provide a sampling clock to a data handler such as a serializer/deserializer (SERDES). The enhanced phase-locked loop (EPLL) is operable to take a multi-rate clock input and scale it accordingly to provide a fixed rate clock to the fast phase-locked loop (FPLL) input. The enhanced phase-locked loop (EPLL) can be dynamically reconfigured without affecting operation of other ports in the line card. The fast phase-locked loop (FPLL) and serializer/deserializer (SERDES) sample link data at a fixed rate and pass the data down through the communication system.

22 Claims, 8 Drawing Sheets

OTHER PUBLICATIONS

MT8941 "Advanced T1/CEPT Digital Trunk PLL", Mitel Jul. 1993.*
Watanabe, "34.1 Gbps low jitter, low BER high-speed parallel CMOS interface for interconnections in high-speed memory test system", Proceedings ITC 2004, International Test Conference, 2004, 2004 pp. 1255-1262.*

Altera Corporation, Stratix II Device Handbook, vol. 2, *1. PLLs in Stratix II Devices*, pp. 1-1 thru 1-80, Jan. 2005, San Jose, California.

* cited by examiner

US 7,512,204 B1

MULTI-PHASE-LOCKED LOOP (PLL) SOLUTION FOR MULTI-LINK MULTI-RATE LINE CARD APPLICATIONS

BACKGROUND OF THE INVENTION

1. Field of the Invention

The present invention relates to data communication, and more particularly, to the handling of data in multi-link multi-rate line cards.

2. Description of Related Art

In communication systems, line cards are used to receive and transmit traffic at network switches. Conventional line cards include multiple ports linked to other network entities such as hosts, routers, servers, other switches, etc. Many line cards have multiple ports that are all configured to handle particular data rates, such as 10 Gbps, 2.5 Gbps, 622 Mbps, 155 Mbps, etc.

However, some configurations may require that particular line cards or particular ports support different data rates. When the data rate for a single port or link changes, it is often necessary to bring the entire line card down. However, bringing the entire line card down prevents other ports or links from operating without interruption. Interrupting other ports or links can lead to dropped packets and adversely impact system performance.

Thus, there is a need for improved techniques and mechanisms that allow multi-link multi-rate line cards to operate efficiently and reliably.

SUMMARY OF THE INVENTION

The present invention provides mechanisms and techniques for handling data in a multi-link multi-rate communication system. Link rates associated with particular ports/links in a line card can be dynamically changed without affecting the operation of other ports. Various control mechanisms may be implemented to facilitate the dynamic modification of link rates. For example, mechanisms can be used for dynamically regulating clock signals according to changes to the data rate.

In one aspect, the present invention provides a line card associated with a network device. The line card includes a first phase-locked loop (PLL), a second PLL, and a data handler. Both the first and second PLLs are associated with a line card link. The first PLL includes dynamically reconfigurable parameters. The second PLL is connected to the output of the first PLL. The data handler is connected to the output of the second PLL. The data handler is configured to process data received at the line card link using clocking information provided by the first and second PLLs.

In another aspect, the present invention provides a semiconductor device that includes a first PLL, a second PLL, and a data converter. The first PLL is operable to receive a link's reference clock signal and regulate the link's reference clock signal to generate a regulated clock signal. The second PLL is operable to receive the regulated clock signal and generate a sampling clock signal. The regulated clock signal has a frequency within the operating frequency range of the second PLL. The data converter is operable to: 1) receive link data; 2) convert the link data from serial data to parallel data; 3) sample link data using the sampling clock signal; and 4) output a converted and sampled version of link data.

In another aspect, the present invention provides a method for handling data in a semiconductor device. A first link's data signal and clock signal are received. While the semiconductor device is running, a first PLL on the semiconductor device is configured to regulate the received first link's clock signal in producing a sampling clock signal for sampling the first link's data signal.

Accordingly, the present invention provides many advantages. For example, the present invention may be implemented within a single programmable chip. It also allows multi-link multi-rate line cards to operate efficiently and reliably.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
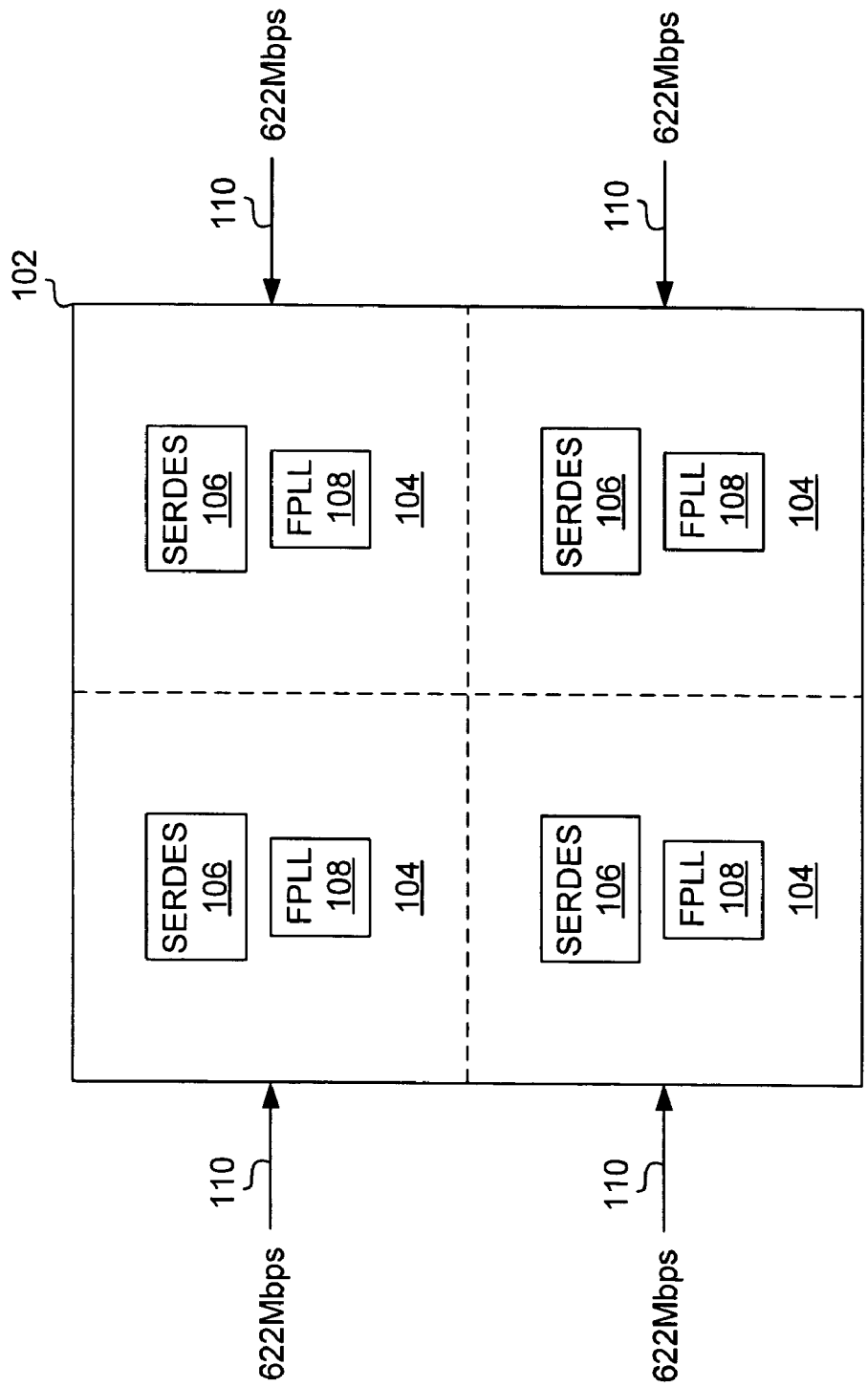
FIG. 1 is a block diagram of a semiconductor device having components for handling multi-link single rate line cards.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

However, it should be noted that the techniques of the present invention can be applied to a variety of types of devices. In the following description, numerous specific details are set forth in order to provide a thorough understanding of the present invention. The present invention may be practiced without some or all of these specific details. In other instances, well known process operations have not been described in detail in order not to unnecessarily obscure the present invention. Furthermore, techniques and mechanisms of the present invention will sometimes be described in singular form for clarity. However, it should be noted that some embodiments can include multiple iterations of a technique or multiple instantiations of a mechanism unless noted otherwise.

Overview

The techniques and mechanisms of the present invention are applicable to integrated circuits that support programmability. Integrated circuits that are programmable by a user to produce a custom design include programmable logic devices (PLDs). Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Some application specific integrated circuits (ASICS) also support some degree of programmability. Often, such PLDs are designed and programmed by a design engineer using an electronic design automation tool that takes the form of a software package.

Line cards transfer data via established links in the communication system. Data can be transferred either in serial or in parallel and can be converted to the other form depending on the application. In general, a serializer/deserializer (SERDES) is used for facilitating the conversion. Serializer/deserializer (SERDES) may be implemented as a stand-alone chip or as a part of a larger system on a chip. It will be appreciated by those skilled in the art that serializer/deserializer (SERDES) can be implemented in different capacities. For instance, they can be used in a receiver, a transmitter, or a transceiver. In order to maintain proper sampling of data entering a serializer/deserializer (SERDES), a PLL is often used. Any mechanism used to regulate, monitor, or provide a clock source is referred to herein as a PLL. Most PLLs are well known by those skilled in the art and used for frequency synthesis. Examples of a PLL are an fast phase-locked loop (FPLL) and an enhanced phase-locked loop (EPLL), which are both available from Altera Corporation, San Jose, Calif.

Conventionally, an FPLL and SERDES handle data by receiving data and clock signals for a particular link. The FPLL typically has parameters that are fixed and can accept only a limited range of values for the clock signals. For instance, if the clock frequency changes to a value outside this acceptable limited range, the FPLL and the SERDES would incorrectly handle the data. The data rate and the clock frequency usually have a fixed relationship. Therefore, if the data rate to clock frequency ratio changes, the FPLL may no longer work to transfer correct data. Typically, the data rate and clock frequency are predetermined based on the line card's requirements (e.g., 840 Mbps and 105 MHz: 8× data rate to clock frequency relationship).

Accordingly, the present invention provides techniques and mechanisms for handling data in multi-link multi-rate line cards. Generally, "multi-link" refer to multiple links included in a communication system or multiple links included on a line card. On the other hand, "multi-rate" refers to multiple rates handle by one or more links. Aspects of the present invention allow dynamic real-time regulation of a link rate based on changes in the corresponding clock frequency and/or data rate. According to various embodiments, the techniques and mechanisms of the present invention allow dynamic modification/adaptability of a link rate without affecting operation of other links or ports on a line card. For example, by using a reconfigurable clock source (i.e., EPLL), the semiconductor device can remain running while parameters of the clock source are reconfigured on the fly (e.g., real-time). FPLL and other conventional PLLs have fixed parameters and cannot be reconfigured on the fly.

Many benefits can be realized with the present invention. The present invention can leverage off of conventional techniques and mechanisms for handling multi-link common rate (e.g., single rate) line cards; thereby, minimizing the impact to die costs. Also, the present invention can significantly enhance the adaptability of multi-link multi-rate line cards. For instance, the present invention allows the combination of different rates within a single line card as opposed to having multiple line cards with specific rates. Further, each link of a line card can have a different and/or wider dynamic range. Moreover, the present invention can allow the ability to adapt to a data rate change on a particular link without bringing down the other links.

According to various embodiments, a multiple phase-locked loop (multi-PLL) solution is provided for handling multi-link multi-rate line cards. A reconfigurable enhanced PLL (EPLL) is cascaded with a fast PLL (FPLL), and the output is used to provide a sampling clock to a serializer/deserializer (SERDES). The EPLL is operable to take a multi-rate clock input and scale it accordingly to provide a fixed rate clock to the FPLL input. This is achieved by reconfiguring the EPLL upon a data rate change. An EPLL can be reconfigured independently of the rest of a programmable device to allow the other links on the device to continue operating substantially without any interruption. The FPLL and SERDES sample the data link at a fixed rate and pass the data down through the communication system.

Multi-Link Single Rate Line Card Example

To further elaborate, FIG. 1 is a block diagram of a semiconductor device 102 having components for handling multi-link single-rate line cards. As shown, four links 110 of a line card connect to semiconductor device 102. Any mechanism used for providing link connections for data communication between two network entities is referred to herein as a line card. A synchronous optical network (SONET) line card, an Internet Protocol line card, and a fibre channel line card are examples of line cards.

Conventionally, links 110 associated with a line card have the same data rate (e.g., 622 Mbps) and/or clock frequency. Each link is handled by a serializer/deserializer (SERDES) 106 and a fast PLL (FPLL) 108. Generally, a link is provided with a serial data signal where SERDES 106 is operable to convert the serial data signal into parallel data signals. According to various embodiments, FPLL 108 provides a sampling clock signal directly from a link's clock frequency where the sampling clock signal can be used to sample a link's data signal in SERDES 106. In addition, each link can be associated with a different portion 104 (separated by dashed lines in FIG. 1) of semiconductor device 102.

As with other conventional PLLs, FPLL 108 is functionally stable when operating within a predetermined operating range, which is typically fixed at the time FPLL 108 is implemented in semiconductor device 102. As such, any link's clock frequency/data rate with a value outside of this operating range may cause FPLL 108 to produce an unexpected output or result; thereby, reducing FPLL's 108 reliability to produce a useful clock source. In order to change the operating ranges, semiconductor device 102 such as an ASIC needs to be remanufactured with the new operating ranges. A semiconductor device 102 such as a FPGA needs to be reprogrammed with the new operating ranges. In either of these cases, semiconductor device 102 needs to be shut down to incorporate the new operating ranges. Since line card applications may incorporate links with different data rates/clock frequencies, semiconductor device 102 is substantially hindered in reliably handling their data.

Depending on the requirements of the line card, the clock frequencies may be different and may be outside the acceptable operating range of the FPLL. Therefore, a single non-configurable PLL solution per link is suitable for line cards that require only a fixed data rate, but not for line cards that require changing data rates.

It should be noted that each link typically includes a data signal having a corresponding data rate and a clock signal having a corresponding clock frequency. The clock frequency and the data rate are related to each other. According to some embodiments, clock frequency to corresponding data rate ratios for different data signals have the same value.

Multi-Link Multi-Rate Line Card Example

Figure 2:
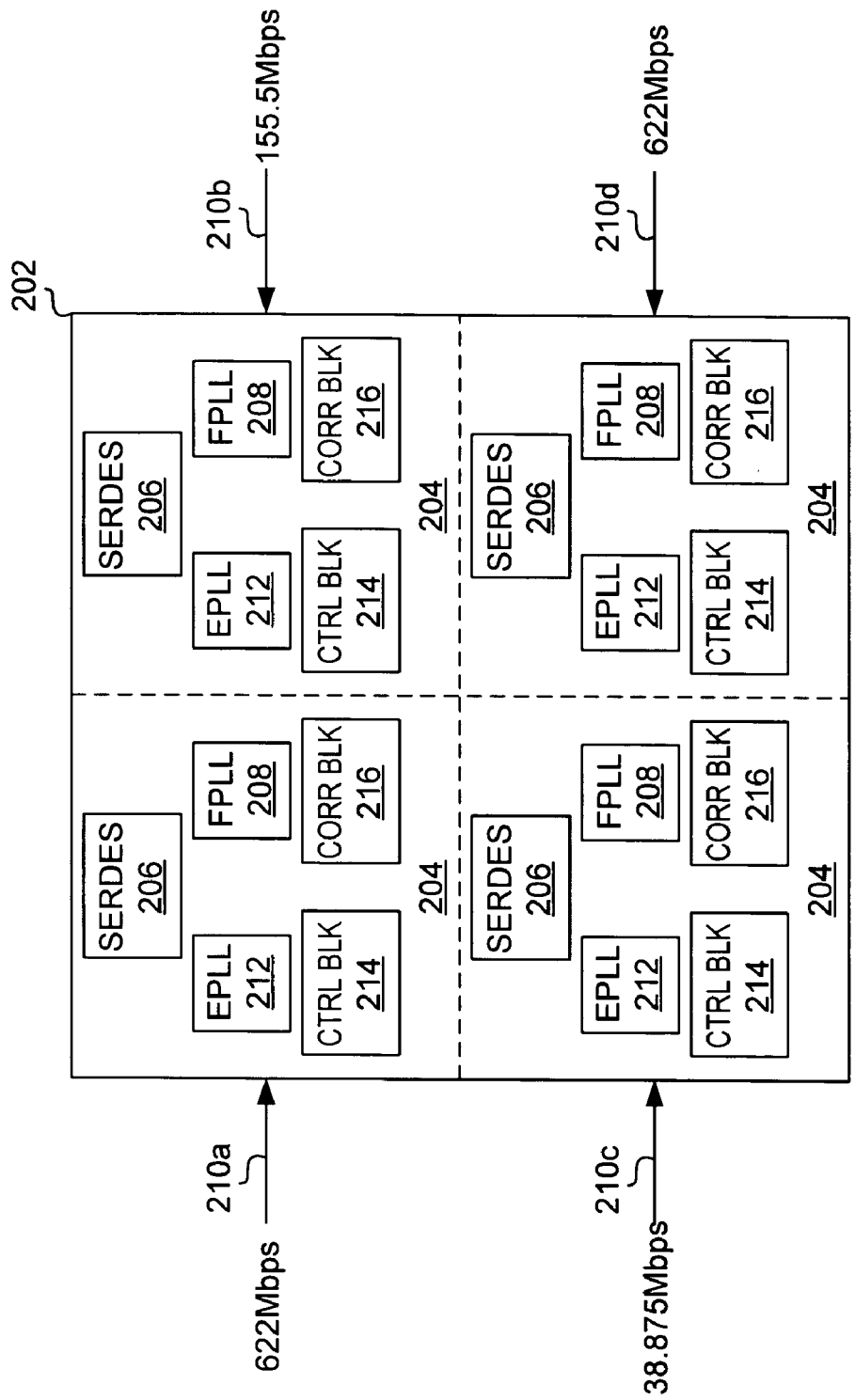
FIG. 2 is a block diagram of a semiconductor device having components for handling multi-link multi-rate line cards.

FIG. 2 is a block diagram of a semiconductor device 202 having components for handling multi-link multi-rate line cards. FIG. 2 illustrates a multi-PLL solution per link for line cards that require changing data rates/clock frequencies or expanded ranges for data rates/clock frequencies. As shown, four links 210a, 210b, 210c, and 210d of a line card are included in a semiconductor device 202. Links 210(a-d) may have either the same or different data rates and/or clock frequencies. For instance, links 210a and 210d each have a data rate of 622 Mbps whereas link 210b has a data rate of 155.5 Mbps and link 210c has a data rate of 38.875 Mbps.

A SERDES 206, FPLL 208, enhanced PLL (EPLL) 212, control block 214, and correction block 216 handle each link. According to some embodiments, SERDES 206, control block 214, and/or correction block 216 can be separately integrated into single units shared by the links. For example, a common SERDES 206, a common control block 214, and/or a common correction block 216 can handle different links.

In general, SERDES 206 is operable to convert the serial data signal into parallel data signals. According to various embodiments, the combination of EPLL 212 and FPLL 208 provides a sampling clock signal from a link's clock frequency and the sampling clock signal can be used to sample a link's data signal in SERDES 206. According to various embodiments, SERDES 206 and FPLL 208 sample at the same rate. That is, if an application supports four different data rates, SERDES 206 and FPLL 208 sample at the clock frequency corresponding to the highest data rate. As with FIG. 1, each link can be associated with a different portion 204 (separated by dashed lines in FIG. 2) of semiconductor device 202.

SERDES 206 and FPLL 208 can be the same as SERDES 106 and FPLL 108. However, as mentioned earlier, semiconductor device 202 also includes EPLL 212, control block 214, and correction block 216. The design provides a cascaded two-PLL solution (per link) in which the upstream PLL (i.e., EPLL) functions as a frequency pre-scaler to provide the downstream PLL (i.e., FPLL) with a frequency within the downstream PLL's acceptable operating range (e.g., 300-325 MHz). The pre-scaling of the frequency is achieved via a reconfiguration feature of the EPLL. Each time the link is signaled to switch its data rate, the EPLL gets reconfigured by the control block 214 to enable the new input/output clock relationship.

The reconfiguration feature of the EPLL allows the rest of the links and associated data handling circuitry (e.g., SERDES 206, FPLL 208, EPLL 212, control block 214, correction block 216, etc.) to continue operating without interruption. The EPLL output is then fed to the FPLL where it can be boosted or lowered to the appropriate frequency for clocking of the SERDES circuitry. It will be appreciated by those skilled in the art that the data output from SERDES 206 may need to be corrected in order to recover the originally received data on the link. Therefore, correction block 216 is operable to perform the necessary corrections (e.g., oversampling corrections).

Figure 3:
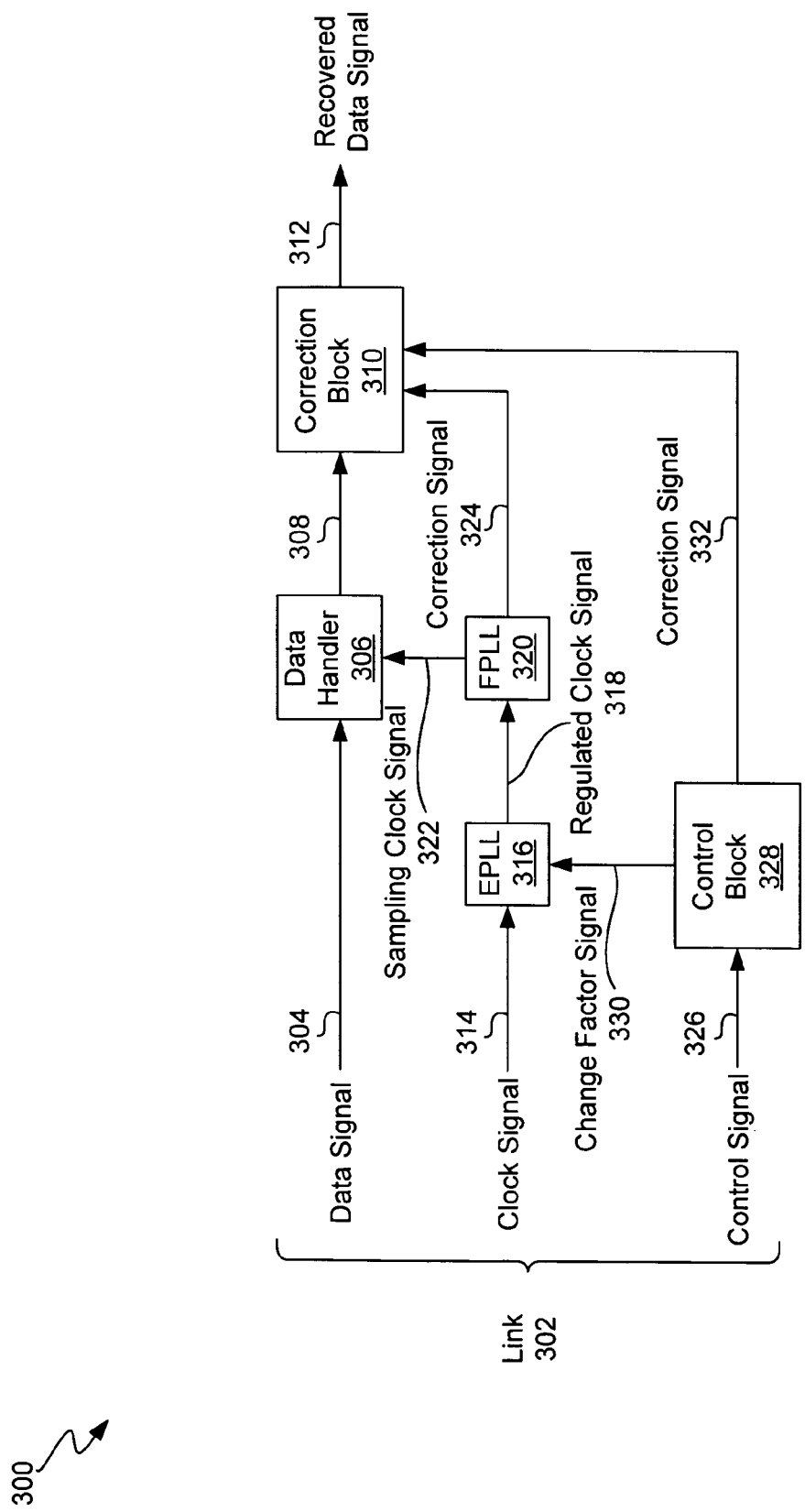
FIG. 3 illustrates a block diagram of a single link having components for handling multi-rate line cards.

To further elaborate, FIG. 3 illustrates a block diagram 300 of a single link 302 having components for handling multi-rate line cards. It should be noted that various control features (e.g., phase alignment) known to those skilled in the art for data handling have been omitted in order to not obscure the present invention. Link 302 includes communication signals such as data signal 304, clock signal 314, and control signal 326.

Clock signal 314 provides a reference clock for sampling data signal 304. Clock signal 314 is fed into an EPLL 316 having reconfigurable parameters. EPLL 316 regulates clock signal 314 and outputs a regulated clock signal 318. Clock signal 314 is regulated based on a change factor signal 330 from control block 328. Regulated clock signal 318 is fed into FPLL 320. Regulated clock signal 318 has a frequency value within the acceptable operating ranges of FPLL 320. Acceptable operating ranges allow stable device operation.

In order to facilitate with the recovery of data signal 304 (e.g., the information originally provided by data signal 304), correction signal 324 may be fed to correction block 310. Correction signal 324 may indicate any changes performed by FPLL to regulated clock signal 318. For example, correction signal 324 may indicate an amplification factor of 2×. According to various embodiments, correction signal 324 may have a value either equal to or less than sampling clock signal 322. As mentioned earlier, FPLL 320 will be set to sample at a clock frequency corresponding to the highest data rate of all the links of the line card. According to various embodiments, regulated clock signal 318 can be conditioned so that the FPLL 320 can produce a sampling clock signal 322 that will oversample data signal 304. The oversampling allows the information from data signal 304 to be recoverable from signal 308.

Control signal 326 is fed to a control block 328 to facilitate reconfiguring EPLL 316. Any mechanism for monitoring and adjusting for a link's data rate or a link's clock frequency is referred to herein as a control block. Control signal 326 can provide any value useful for dynamically adjusting the parameters of EPLL 316 for changes in the data rate and/or clock frequency. Control signal 326 may indicate the data rate, clock frequency, or other value associated with the data signal 304. Control block 328 may include any logic for dynamically reconfiguring EPLL 316 according to the current data rate and/or clock frequency. Typically, control block 328 is operable to determine the change factor signal 330 that is necessary for reconfiguring EPLL 316. Change factor signal 330 may be based on either a data rate value or a clock frequency value or both. Control block 328 may also output a correction signal 332 to correction block 310 for recovering data signal 304 (e.g., the information originally provided by data signal 304) from a converted/sampled version 308. Correction signal 332 may indicate a value corresponding to change factor signal 330. Correction signal 332 may indicate any changes performed by EPLL 316 to clock signal 314. For example, correction signal 332 may indicate an amplification factor of 8×.

As shown, data signal 304 is fed to a data handler 306 (e.g., SERDES). Data handler 306 is operable to convert (e.g., from a first form to a second form) and/or sample data signal 304. Typically, a serial to parallel data signal conversion or vice versa is employed to handle data signal 304. The sampling feature of data handler 306 is implemented with sampling clock signal 322. Data handler 306 may also wait for an acknowledgement from EPLL 316 and/or FPLL 320 before data handler 306 begins handling data signal 304 and outputting a converted and/or sampled version of data signal 304 in signal 308. For example, EPLL 316 and/or FPLL 320 may acknowledge locking (e.g., phase alignment) onto their corresponding input signals.

Any mechanism for correcting sampling issues (e.g., oversampling) in data signal 304 is referred to herein as a correction block. Correction block 310 is operable to correct for sampling errors resulting from the use of sampling clock signal 322. According to various embodiments, correction block 310 is able to generate a recovered data signal 312 (e.g., recovering data signal 304 from signal 308) based on correction signals 324 and/or 332.

The present invention recognizes that the reason a single conventional non-configurable PLL solution is inadequate is because of its limited operating frequencies. A PLL is generally optimized to operate within a certain set of frequencies for optimal performance. This limitation makes it difficult to switch between different operating frequencies when using a PLL without reconfigurable parameters. The reconfigurable parameters of the present invention allow the ability to dynamically change the input/output characteristics of the PLL without having to reconfigure/reprogram the entire programmable device and bring down the other links.

The techniques and mechanisms of the present invention can be used in SONET based networks. Suppose frequency rates are 622 MHz, 155.5 MHz, and 38.875 MHz. In this situation, a non-reconfigurable PLL (e.g., FPLL) might be able to handle only some of the frequency rates due to its operating range (e.g., 100-300 MHz). Using the EPLL reconfiguration feature allows all three frequency rates to be handled and accepted.

In the 622 MHz case, the EPLL will divide the incoming clock by 2 to bring the output frequency down to 311 MHz. In the 155.5 MHz case, the EPLL will be reconfigured to multiply the incoming clock by 2 to bring the output frequency up to 311 MHz. In the 38.875 MHz case, the EPLL will be reconfigured to multiply the incoming clock by 8 to bring the output frequency up to 311 MHz.

In each case, the output frequency of the EPLL is 311 MHz, which is within the FPLL's operating range. This output is then fed to the FPLL input, which is set to a constant multiply by two setting. The boosted clock, now 622 MHz, is then used to clock the received data into the SERDES. Note that in each of the above cases, the data will be oversampled differently. The 622 MHz, 155.5 MHz, and 38.875 MHz cases will be oversampled respectively by factors of 1, 4, and 16. Therefore, further logic as described earlier may be used to handle this oversampling.

Figure 4:
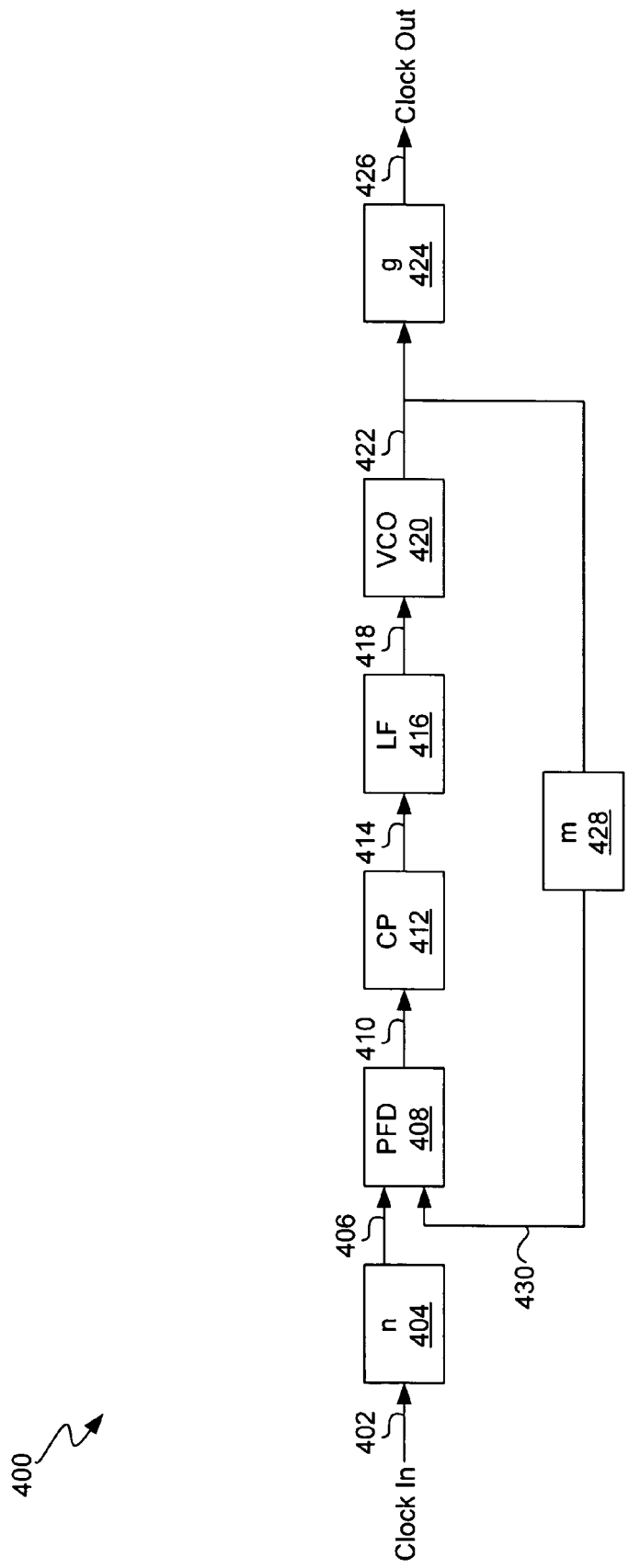
FIG. 4 illustrates a block diagram of a reconfigurable enhanced phase-locked loop (EPLL) component.

FIG. 4 illustrates a block diagram 400 of a reconfigurable enhanced phase-locked loop (EPLL) component. EPLL includes a pre-scale/input counter 404, a phase frequency divider (PFD) 408, a charge pump (CP) 412, a loop filter (LF) 416, a voltage controlled oscillator (VCO) 420, a post-scale/output counter 424, and a feedback counter 428. Counters 404, 424, and 428 provide either a divide or multiplication function. Counters 404, 424, 428, CP 412, and/or LF 416 are parameters that can be reconfigured during a link's data rate/clock frequency change. Many of the components of the EPLL function similarly to those in a conventional PLL.

The EPLL can either boost up or divide down frequencies. Suppose reference clock of 100 MHz is input signal 402 and an output signal 426 of 200 MHz is desired. Counter 404 is operable to precondition the input frequency to be in a desired range. Most of the time, n=1 where counter 404 produces reference clock 406. PFD 408 is operable to compare the phase and the frequency of the reference clock 406 and the feedback clock 430. In general, PFD 408 monitors the edges of the reference clock 406 and the feedback clock 430. The output of PFD 408 may include signals 410 for up and down charge values for CP 412. If the feedback clock 430 is slower than the reference clock 406, the EPLL needs to speed up the feedback clock 430 to match with the reference clock 406. PFD 408 is operable for conducting phase alignment between different clock signals.

CP 412 receives the signals 410 and outputs a current 414 into LF 416 where current 414 is translated into a voltage 418 for sending to VCO 420. Based on voltage 418, VCO 420 outputs an output frequency 422. The output 422 of VCO 420 gets fed into the feed back loop and is typically divided down via feedback counter 428 into a slower version of the oscillating signal and fed back to PFD 408. A divider (m=2) in feedback counter 428 actually causes a multiplication effect (e.g., ×2) in the forward path. As such, a 200 MHz output clock 426 can be generated from a 100 MHz input clock 402 if post-scale/output counter 424 also has a divider (g=1). Counters 404, 424, and 428 allow the VCO to operate in its stable range.

Flow Diagrams

Figure 5:
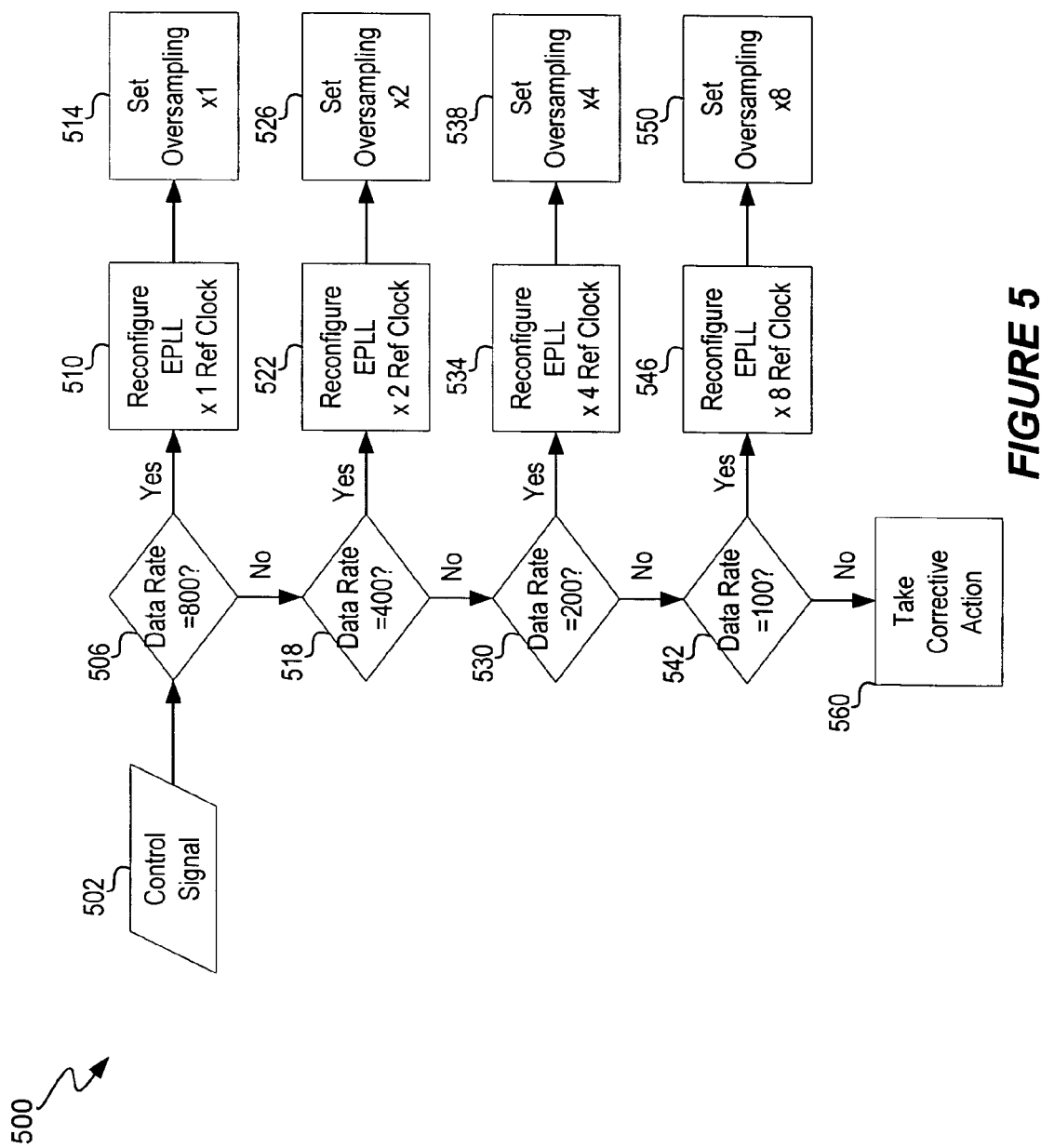
FIG. 5 is a flow process diagram for handling multi-link multi-rate line cards with a control block.

FIG. 5 is a flow process diagram 500 for configuring multi-link multi-rate line cards with a control block. In one example, the line card requires four different data rates (e.g., 800 Mbps, 400 Mbps, 200 Mbps, and 100 Mbps) per link. In this example, the FPLL generates a sampling clock signal of regulated clock signal ×1. Corresponding clock rates, EPLL change factors, and EPLL clock outputs to FPLL (i.e., regulated clock signals) are shown in Table 1.

TABLE 1

| Application Data Rate (Mbps) | Application Ref. Clock Rate (MHz) | EPLL Change Factor | Regulated clk signal (MHz) |
|---|---|---|---|
| 800 | 100 | ×1 | 100 |
| 400 | 50 | ×2 | 100 |
| 200 | 25 | ×4 | 100 |
| 100 | 12.5 | ×8 | 100 |

At 502, a control signal indicating the current data rate is received. A determination of whether the received data rate equals to 800 Mbps is performed at 506. If the determination is affirmative in 506, the EPLL is reconfigured to generate a regulated clock signal of "reference clock signal ×1" at 510. Next, at 514, the oversampling in correction block is set (via correction signal) to ×1. If the determination is negative in 506, a determination of whether the received data rate equals 400 Mbps is performed at 518. If the determination is affirmative in 518, the EPLL is reconfigured to generate a regulated clock signal of "reference clock signal ×2" at 522. Next, at 526, the oversampling in correction block is set (via correction signal) to ×2. If the determination is negative in 518, a determination of whether the received data rate equals to 200 Mbps is performed at 530.

If the determination is affirmative in 530, the EPLL is reconfigured to generate a regulated clock signal of "reference clock signal ×4" at 534. Next, at 538, the oversampling in correction block is set (via correction signal) to ×4. If the determination is negative in 530, a determination of whether the received data rate equals to 100 Mbps is performed at 542. If the determination is affirmative in 542, the EPLL is reconfigured to generate a regulated clock signal of "reference clock signal ×8" at 546. Next, at 550, the oversampling in correction block is set (via correction signal) to ×8. If the determination is negative in 542, corrective action is taken at 560. Corrective action may include sending an error notification to the user or searching in memory for other available data rates and configuration settings that can be substituted in flow process diagram 500.

Figure 6:
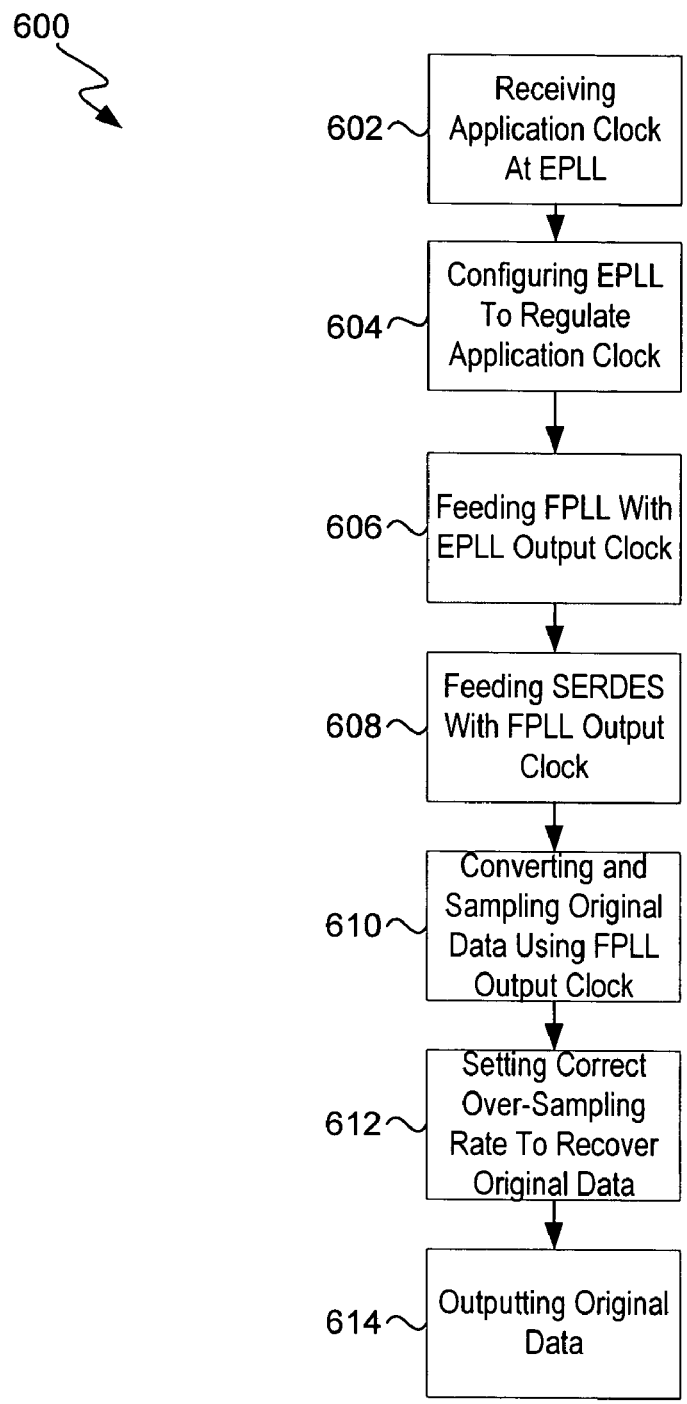
FIG. 6 is a flow process diagram for handling a single link on a multi-rate line card.

FIG. 6 is a flow process diagram 600 for handling link rate changes at a single link. At 602, the application reference clock is received at EPLL. At 604, EPLL is configured to regulate the application reference clock. At 606, the FPLL is fed with the EPLL output clock (i.e., regulated clock signal). At 608, the SERDES if fed with the FPLL output clock (i.e., sampling clock signal). At 610, the original data signal is converted and sampled using the FPLL output clock. At 612, the correct oversampling rate (based on correction signals) is set to recover the original data signal. At 614, the original data signal is outputted. It will be appreciated by those skilled in the art that flow process diagrams 500 and 600 include steps that may be rearranged, modified, or omitted.

Programmable Chip Example

Figure 7:
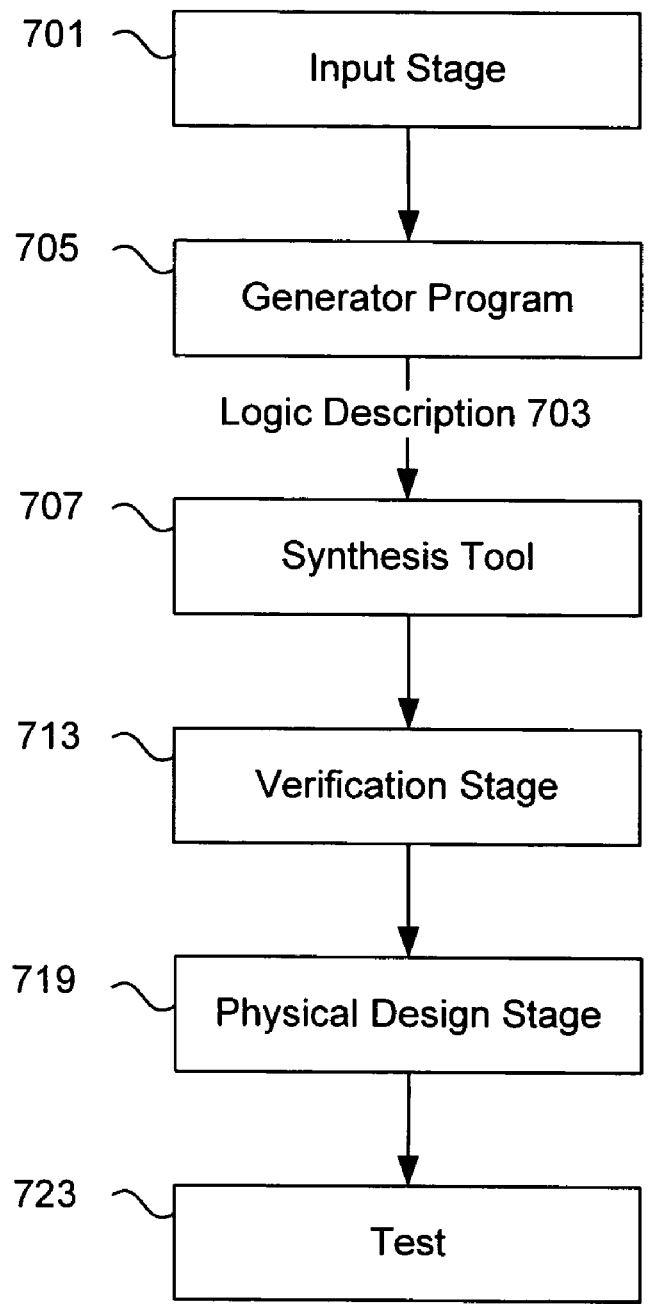
FIG. 7 is a flow process diagram showing a technique for implementing a programmable chip.

FIG. 7 is a diagrammatic representation showing implementation of a system on a programmable chip. An input stage 701 receives selection information typically from a user for logic such as a processor core as well as other components such as a data handler (e.g., SERDES), EPLL, FPLL, control block, or correction block to be implemented on an electronic device. In one example, the input received is in the form of a high-level language program. A generator program 705 creates a logic description and provides the logic description along with other customized logic to any of a variety of synthesis tools, place and route programs, and logic configuration tools to allow a logic description to be implemented on an electronic device. In some examples, the programmable chip may include a hard-coded transceiver. The Stratix GX device available from Altera Corporation of San Jose, Calif. is one example of a programmable chip having a hard-coded transceiver.

In one example, an input stage 701 often allows selection and parameterization of component modules to be used on an electronic device. In some examples, components provided to an input stage include intellectual property functions, megafunctions, and intellectual property cores. The input stage 701 may be a graphical user interface using wizards for allowing efficient or convenient entry of information. The input stage may also be a text interface or a program reading a data file such as a spreadsheet, database table, or schematic to acquire selection information. The input stage 701 produces an output containing information about the various modules selected.

In typical implementations, the generator program 705 can identify the selections and generate a logic description with information for implementing the various modules. The generator program 705 can be a Perl script creating HDL files such as Verilog, Abel, VHDL, and AHDL files from the module information entered by a user. In one example, the generator program identifies a portion of a high-level language program to accelerate. The other code is left for execution on a processor core.

According to various embodiments, the generator program 705 identifies pointers and provides ports for each pointer. One tool with generator program capabilities is System on a Programmable Chip (SOPC) Builder available from Altera Corporation of San Jose, Calif. The generator program 705 also provides information to a synthesis tool 707 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 701, generator program 705, and synthesis tool 707 can be separate programs. The interface between the separate programs can be a database file, a log, or simply messages transmitted between the programs. For example, instead of writing a file to storage, the input stage 701 can send messages directly to the generator program 705 to allow the generator program to create a logic description 703. Similarly, the generator program can provide information directly to the synthesis tool instead of writing HDL files. Similarly, input stage 701, generator program 705, and synthesis tool 707 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence N.C.-Verilog and NC-VHDL available from Cadence Design Systems of San Jose, Calif. After the verification stage 713, the synthesized netlist file can be provided to physical design tools 719 including place and route and configuration tools. A place and route tool typically locates logic cells on specific logic elements of a target hardware device and connects wires between the inputs and outputs of the various logic elements in accordance with logic required to implement an electronic design. The device can also be physically tested at 723.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 8:
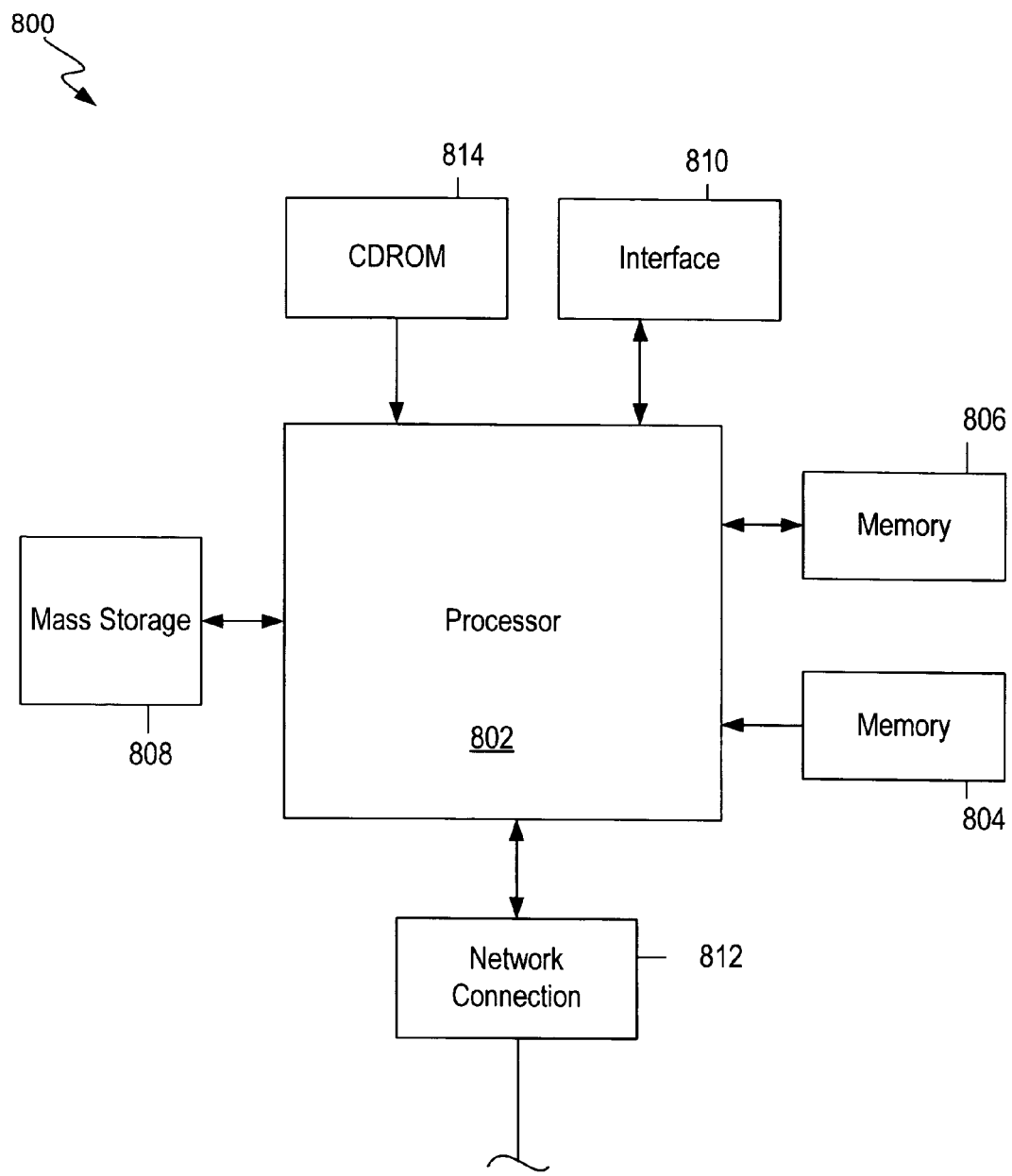
FIG. 8 is a block diagram of a computer system.

FIG. 8 illustrates a typical computer system that can be used to implement a programmable chip having components for handling multi-link multi-rate line cards. The computer system 800 includes any number of processors 802 (also referred to as central processing units, or CPUs) that are coupled to devices including memory 806 (typically a random access memory, or "RAM"), memory 804 (typically a read only memory, or "ROM"). The processors 802 can be configured to generate a test sequences for any designated processor. As is well known in the art, memory 804 acts to transfer data and instructions uni-directionally to the CPU and memory 806 is used typically to transfer data and instructions in a bi-directional manner.

Both of these memory devices may include any suitable type of the computer-readable media described above. A mass storage device 808 is also coupled bi-directionally to CPU 802 and provides additional data storage capacity and may include any of the computer-readable media described above. The mass storage device 808 may be used to store programs, data and the like and is typically a secondary storage medium such as a hard disk that is slower than memory. The mass storage device 808 can be used to hold a library or database of prepackaged logic or intellectual property functions, as well as information on generating particular configurations. It will be appreciated that the information retained within the mass storage device 808, may, in appropriate cases, be incorporated in standard fashion as part of memory 806 as virtual memory. A specific mass storage device such as a CD-ROM 814 may also pass data uni-directionally to the CPU.

CPU 802 is also coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. It should be noted that the system 800 may also be associated with devices for transferring completed designs onto a programmable chip. The above-described devices and materials will be familiar to those of skill in the computer hardware and software arts.

The hardware elements described above may be configured to act as multiple software modules for performing the operations of this invention. For example, instructions for running a generator program, input stage (e.g., a wizard), and/or compiler may be stored on mass storage device 808 or 814 and executed on CPU 802 in conjunction with primary memory 806.

While the invention has been particularly shown and described with reference to specific embodiments thereof, it will be understood by those skilled in the art that changes in the form and details of the disclosed embodiments may be made without departing from the spirit or scope of the invention. For example, many of the components may be modified or rearranged for use with a receiver, transmitter, or transceiver. Further, a single reconfigurable PLL solution may be implemented by replacing the EPLL and FPLL combination with only a single EPLL in FIG. 3. It is therefore intended that the invention be interpreted to include all variations and equivalents that fall within the true spirit and scope of the present invention.

We claim:

1. A line card associated with a network device, the line card comprising:
    a first phase-locked loop (PLL) associated with a line card link, the first PLL having dynamically reconfigurable parameters;
    a second PLL associated with the line card link, the second PLL connected to the output of the first PLL;
    a data handler connected to the output of the second PLL, the data handler configured to process data received at the line card link using clocking information provided by the first and second PLLs;
    a control block configured to output a change factor for reconfiguring the first PLL and a correction signal generated using control signal; and,
    a correction block configured to generate a recovered data signal using the data handler output and correction signals from the second PLL and from the control block;
    wherein the reconfigurable parameters are dynamically adjustable without affecting operation of other links associated with the line card.

2. The line card of claim 1, wherein the data handler processes link data by converting link data from a first form into a second form.

3. The line card of claim 2, wherein the first and second forms are selected from the group consisting of serial data and parallel data.

4. The line card of claim 3, wherein the data handler is a serializer/deserializer (SERDES).

5. The line card of claim 4, wherein the line card is associated with a transceiver.

6. The line card of claim 4, wherein the line card includes a programmable device.

7. The line card of claim 1, wherein the data handler processes link data by sampling link data using a sampling clock resulting from a cascaded arrangement of the first and second PLLs.

8. The line card of claim 1 further comprising:
    a third phase-locked loop (PLL) associated with a line card second link, the third PLL having dynamically reconfigurable parameters;

a fourth PLL associated with the line card second link, the fourth PLL connected to the output of the third PLL; and a second data handler operable to process data received at the line card second link using clocking information provided by the third and fourth PLLs.

9. The line card of claim 8, wherein the second data handler processes the second link data by sampling the second link data using a second sampling clock resulting from a cascaded arrangement of the third and fourth PLLs.

10. The line card of claim 9 further comprising:

a second control block operable to reconfigure the third PLL's parameters according to a second change factor based on the second link data rate or the second link clock frequency.

11. The line card of claim 10 further comprising:

a second correction block operable to correct for sampling errors resulting from the use of the second sampling clock.

12. The line card of claim 11, wherein the first link data rate and the second link data rate are different.

13. The line card of claim 12, wherein the first and second line card links are for the same line card application.

14. The line card of claim 12, wherein the first and second data handlers are integrated together as a single unit.

15. The line card of claim 12, wherein the first and second control blocks are integrated together as a single unit.

16. The line card of claim 12, wherein the first and second correction blocks are integrated together as a single unit.

17. A semiconductor device comprising:

a first PLL operable to receive a link's reference clock signal and regulate the link's reference clock signal to generate a regulated clock signal based on a change factor signal;

a second PLL operable to receive the regulated clock signal and generate a sampling clock signal, the regulated clock signal having a frequency within the operating frequency range of the second PLL;

a data converter operable to receive link data, convert the link data from serial data to parallel data, sample link data using the sampling clock signal, and output a converted and sampled version of link data;

a control block configured output the change factor signal for reconfiguring the first PLL and a correction signal based on a control signal; and, a correction block configured to generate a recovered data signal based on the data handler output and correction signals from the second PLL and from the control block.

18. A method for handling data in a semiconductor device, the method comprising:

receiving a first link's data signal at the semiconductor device;

receiving a first link's clock signal at the semiconductor device;

receiving a first link's control signal at the semiconductor device;

determining a change factor based on the first link's control signal;

while the semiconductor device is running, configuring a first PLL to regulate the received first link's clock signal using the change factor;

outputting the regulated first link's clock signal from the first PLL to a second PLL on the semiconductor device, wherein the regulated first link's clock signal has a frequency within the operating range of a second PLL;

producing a sampling clock signal for sampling the first link's data signal; and correcting the converted and sampled first link's data signal to a recovered data signal.

19. The method of claim 18 further comprising:

converting the received first link's data signal from serial data signal to parallel data signals.

20. The method of claim 18, wherein the semiconductor device is a programmable device.

21. The method of claim 18, further comprising receiving a second link's data signal at the semiconductor device;

receiving a second link's clock signal at the semiconductor device;

receiving a second link's control signal at the semiconductor device;

determining a change factor based on the second link's control signal;

while the semiconductor device is running, configuring a third PLL to regulate the received second link's clock signal using the change factor;

outputting the regulated second link's clock signal from the third PLL to a fourth PLL on the semiconductor device, wherein the regulated second link's clock signal has a frequency within the operating range of a fourth PLL;

producing a sampling clock signal for sampling the second link's data signal; and correcting the converted and sampled second link's data signal.

22. The method of claim 21, wherein the first link's clock signal and the second link's clock signal are different.

* * * * *